United States Patent
Kelley et al.

(10) Patent No.: US 11,555,632 B2
(45) Date of Patent: Jan. 17, 2023

(54) MODULAR SLIM SIGHT-PROOF AIR INTAKE ASSEMBLY

(71) Applicant: Toshiba International Corporation, Houston, TX (US)

(72) Inventors: John Kelley, Crockett, TX (US); Enrique Martinez, Cypress, TX (US)

(73) Assignee: Toshiba International Corporation, Houston, TX (US)

( * ) Notice: Subject to any disclaimer, the term of this patent is extended or adjusted under 35 U.S.C. 154(b) by 16 days.

(21) Appl. No.: 17/341,695

(22) Filed: Jun. 8, 2021

(65) Prior Publication Data
US 2021/0389017 A1  Dec. 16, 2021

Related U.S. Application Data

(60) Provisional application No. 63/037,904, filed on Jun. 11, 2020.

(51) Int. Cl.
*F24F 13/08* (2006.01)

(52) U.S. Cl.
CPC ................. *F24F 13/084* (2013.01)

(58) Field of Classification Search
CPC .. F24F 13/084; F24F 13/082; F24F 2007/003; F24F 2221/52
USPC .......... 454/196, 212, 224, 225, 284
See application file for complete search history.

(56) References Cited

U.S. PATENT DOCUMENTS

| 3,087,412 | A | * | 4/1963 | Holmes | E06B 7/082 |
| | | | | | 454/277 |
| 4,103,601 | A | | 8/1978 | Dayus | |
| 6,776,706 | B2 | * | 8/2004 | Kipka | H05K 7/20181 |
| | | | | | 55/467 |
| 2012/0015596 | A1 | * | 1/2012 | Fang | F24F 13/082 |
| | | | | | 49/31 |

FOREIGN PATENT DOCUMENTS

GB   2275710 A  *  9/1994  .............. F24F 13/08

OTHER PUBLICATIONS

Office action dated Sep. 13, 2022, Canadian Patent Application No. 3,121,037, 5 pages.

* cited by examiner

*Primary Examiner* — Vivek K Shirsat
(74) *Attorney, Agent, or Firm* — Baker Botts L.L.P.

(57) ABSTRACT

The systems and methods disclosed relate to an air intake assembly, wherein the air intake assembly comprises: a frame comprising a plurality of openings, wherein each one of the plurality of openings comprises a V-shaped cross-section. The air intake assembly further comprises a plurality of slats, wherein each one of the plurality of slats comprises a V-shaped cross-section. The air intake assembly further comprises a stiffener configured to provide structural support to the plurality of slats, wherein the stiffener is disposed within an interior of the frame. The plurality of slats are disposed within the frame through the plurality of openings of the frame and through the stiffener.

18 Claims, 3 Drawing Sheets

MODULAR SLIM SIGHT-PROOF AIR INTAKE ASSEMBLY

CROSS-REFERENCE TO RELATED APPLICATIONS

The present application claims benefit of U.S. Provisional Application Ser. No. 63/037,904, entitled "Modular Slim Sight-Proof Air Intake Assembly", filed on Jun. 11, 2020.

TECHNICAL FIELD

Embodiments of the present disclosure relate to an air intake assembly, more particularly, to a modular air intake assembly that is sight-proof.

BACKGROUND

There are updated standards requiring air intake assemblies, or louvers, to be sight-proof while continuing to allow air flow. Existing structures will need to be retro-fitted with such sight-proof air intake assemblies, however, the required dimensions for each assembly varies as each existing structure may be sized differently from one another. Furthermore, there is a need for the horizontal slats to be structurally sound while blocking a line of sight into the existing structure.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Illustrative embodiments of the present disclosure are described in detail herein. In the interest of clarity, not all features of an actual implementation are described in this specification. It will of course be appreciated that in the development of any such actual embodiment, numerous implementation specific decisions must be made to achieve developers' specific goals, such as compliance with system related and business-related constraints, which will vary from one implementation to another. Moreover, it will be appreciated that such a development effort might be complex and time consuming but would nevertheless be a routine undertaking for those of ordinary skill in the art having the benefit of the present disclosure. Furthermore, in no way should the following examples be read to limit, or define, the scope of the disclosure.

Figure 1:
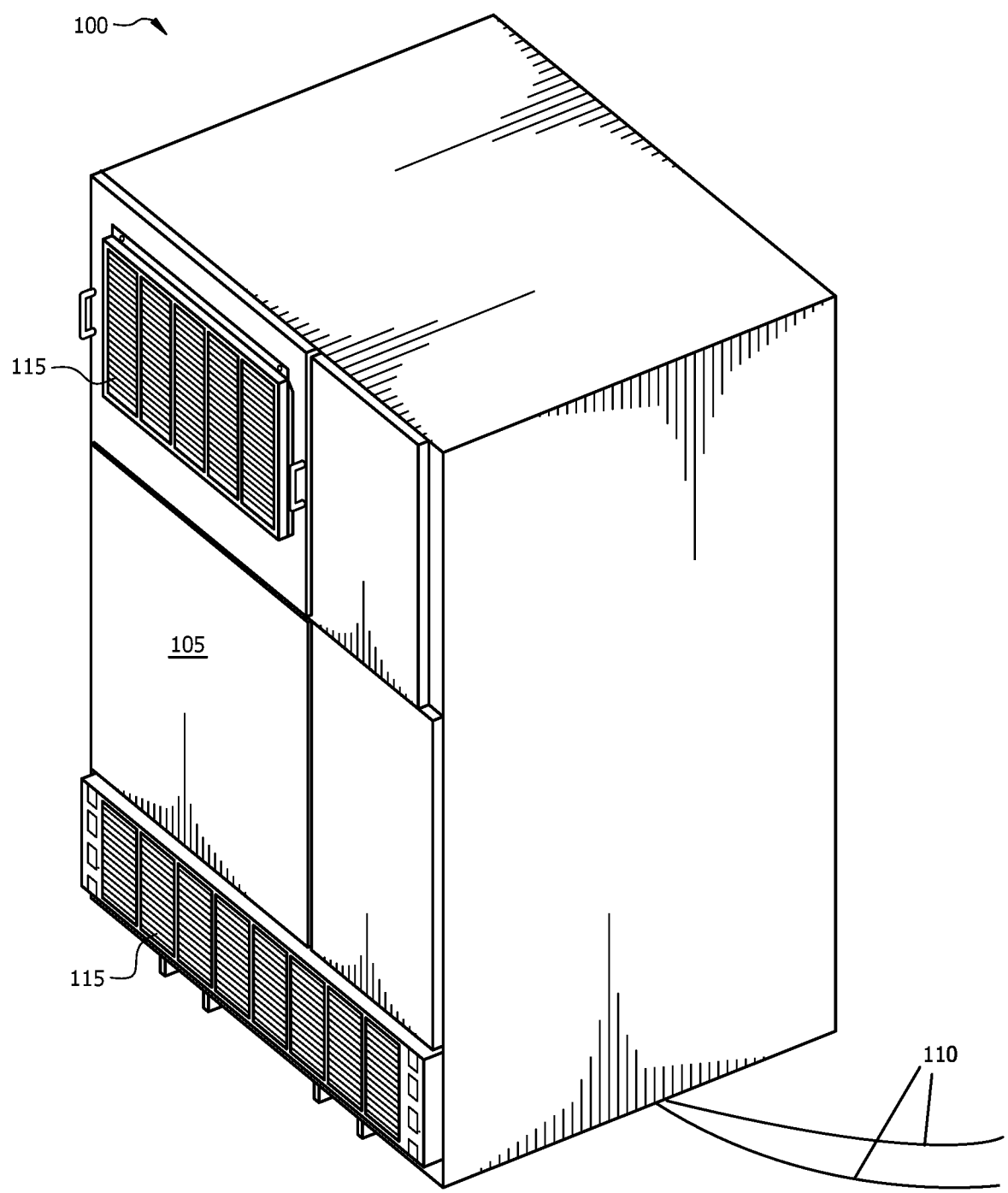
FIG. 1 illustrates a cabinet with an air intake assembly, in accordance with an embodiment of the present disclosure.

FIG. 1 illustrates an isometric view of a cabinet 100. In embodiments, the cabinet 100 may be configured to house or contain any suitable electrical equipment 105, a plurality of cables 110, wiring, and the like. In one or more embodiments, the cabinet 100 may be any suitable size, height, shape, and combinations thereof. The cabinet 100 may comprise any suitable materials. Without limitations, the cabinet 100 may comprise metals, nonmetals, polymers, composites, and combinations thereof. As illustrated, the cabinet 100 may comprise an air intake assembly 115. The air intake assembly 115 may be disposed about any suitable location on the cabinet 100. As shown, the air intake assembly 115 may be disposed on a side of the cabinet 100. In embodiments, the air intake assembly 115 may be configured to provide air flow between an exterior of the cabinet 100 and an interior of the cabinet 100 while inhibiting a line of sight into the cabinet 100. While FIG. 1 illustrates a cabinet 100 utilizing the air intake assembly 115, one of ordinary skill in the art would be able to incorporate the air intake assembly 115 with any other suitable container or modular unit.

Figure 2:
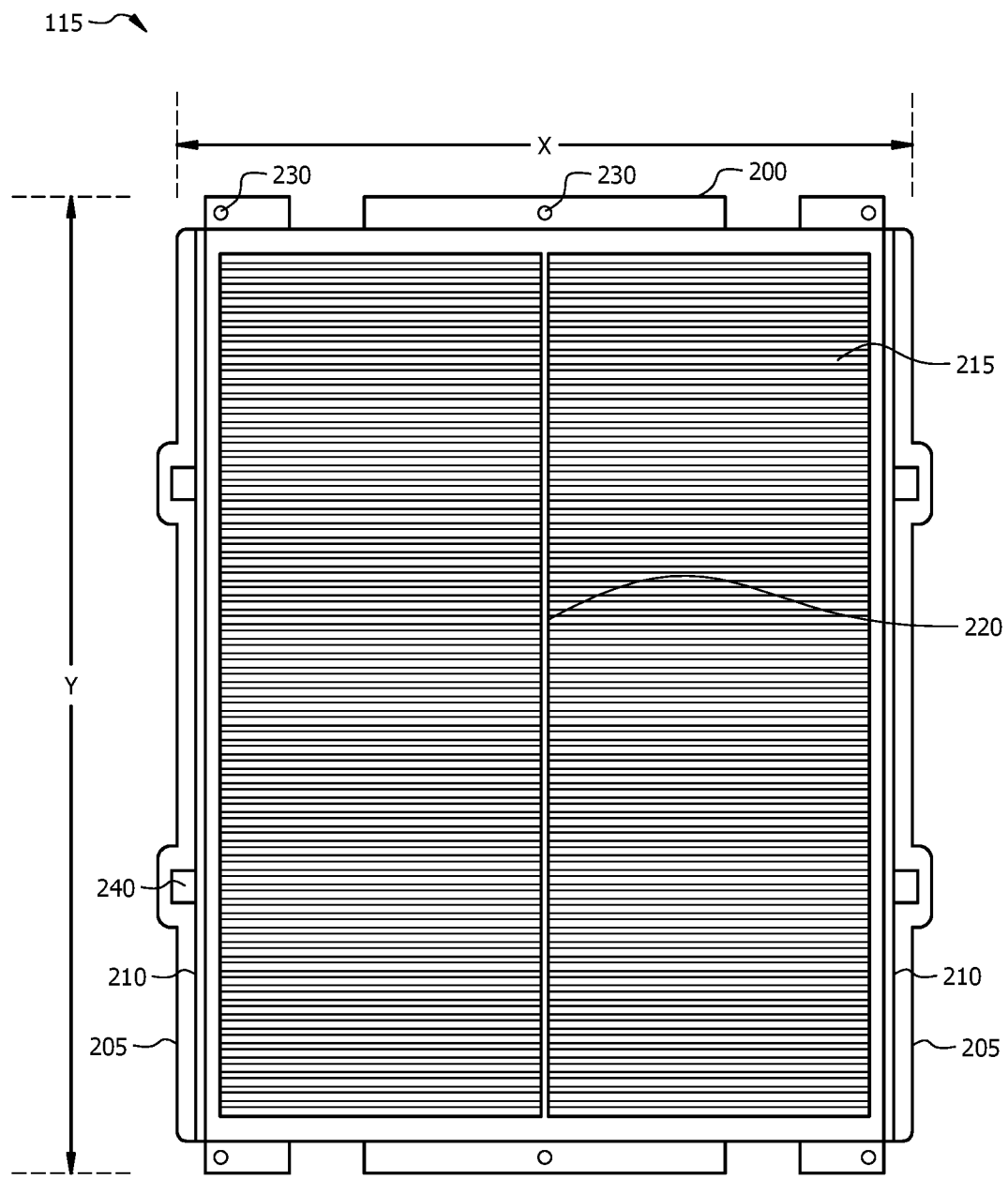
FIG. 2 illustrates a front view of an air intake assembly, in accordance with an embodiment of the present disclosure.
Figure 3:
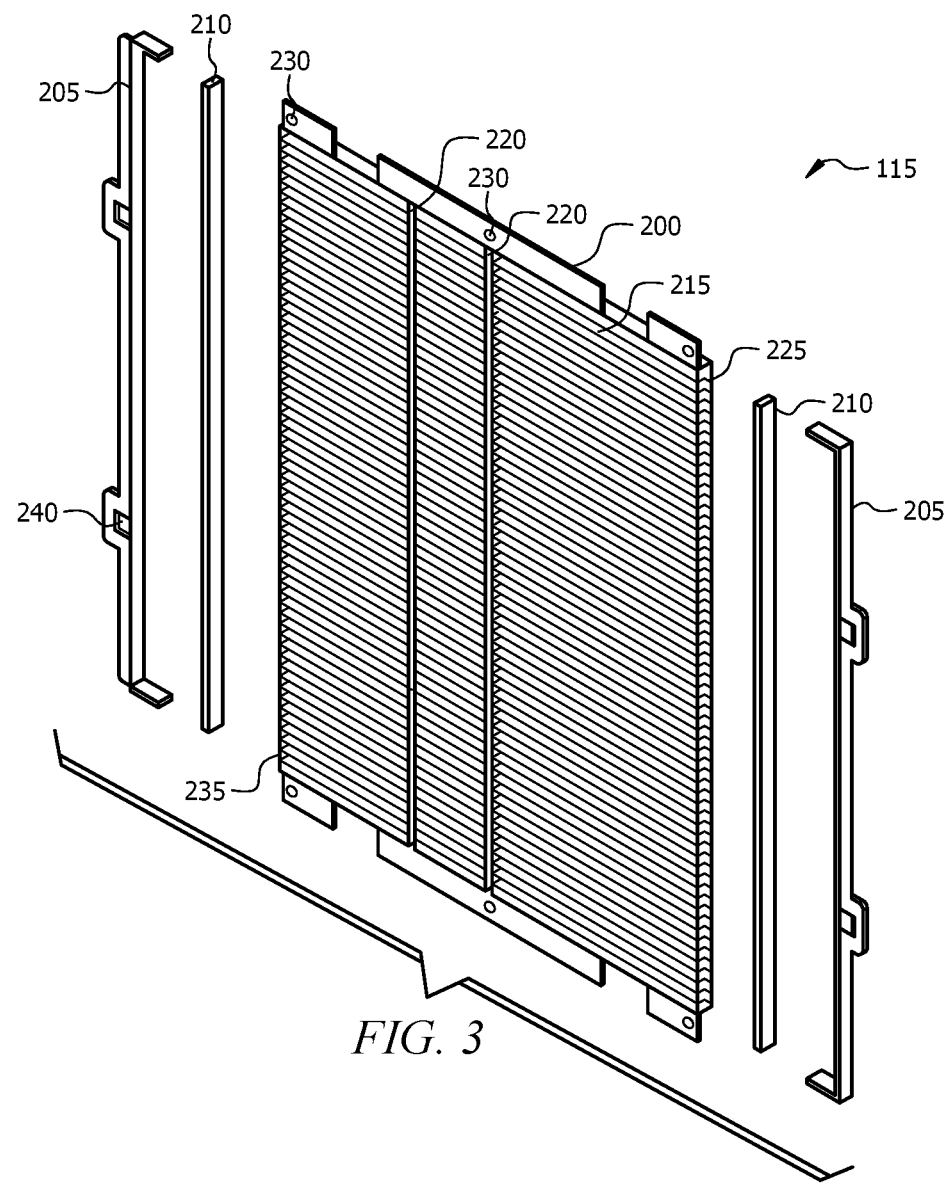
FIG. 3 illustrates an exploded view of an air intake assembly, in accordance with an embodiment of the present disclosure.

FIGS. 2-3 illustrate an exemplary embodiment of an air intake assembly 115. FIG. 2 illustrates a front view of the air intake assembly 115, and FIG. 3 illustrates an exploded view of the air intake assembly 115. In one or more embodiments, the air intake assembly 115 may be configured to provide air flow between an exterior of a structure and an interior of the structure (for example, cabinet 100), wherein the air intake assembly 115 is coupled to or incorporated as a part of the structure. In these embodiments, the air intake assembly may prevent visual access into the structure by obstructing the view of the interior of the structure. Without limitations, the air intake assembly may comprise a frame 200, a bracket 205, a gasket 210, a plurality of slats 215, and a stiffener 220.

The frame 200 may be any suitable size, height, shape, and combinations thereof. As illustrated, the frame 200 may generally have a rectangular or square shape, but the frame 200 is not limited to such a shape. In embodiments, the height and/or width of the frame 200 may be designed so as to be compatible with an existing opening of the structure (for example, cabinet 100), wherein the frame 200 may be disposed within the existing opening. Without limitations, the height and/or width may be any suitable value, and the depth from the structure may be equal to or less than 1 inch. The frame 200 may comprise any suitable materials, such as but not limited to, metals, nonmetals, polymers, ceramics, composites, and combinations thereof. In embodiments, the frame 200 may be comprised of sheet metal. The frame 200 may be configured to receive and contain the plurality of slats 215. In one or more embodiments, there may be a plurality of openings 225 (as best seen in FIG. 3) disposed through the sides of the frame 200, wherein each one of the plurality of slats 215 may be disposed through each of the plurality of openings 225. In these embodiments, the plurality of openings 225 may have the same shape as the cross-section of the plurality of slats 215 (for example, a V-shaped cross-section). In embodiments, the plurality of openings 225 may be uniformly disposed along the sides of the frame 200 and may comprise the same shape as each other opening 225 on a respective side. As illustrated, the frame 200 may further comprise holes 230 to be used to attach the air intake assembly 115 to the structure. In one or more embodiments, suitable fasteners may be used with the holes 230 of the frame 200 to couple the air intake assembly 115 to the structure.

As illustrated, the bracket 205 may be disposed along a side of the frame 200. In embodiments, the gasket 210 may be disposed in between the bracket 205 and that side of the frame 200. As shown, there may be a set of brackets 205 and gaskets 210 disposed along each opposing side of the frame 200. Without limitations, any suitable gasket may be utilized as gasket 210. The gasket 210 may be any suitable size, height, shape, and combinations thereof. In embodiments, the height of the gasket 210 may be similar or approximate to the height of the frame 200 and/or bracket 205. In embodiments, the thickness of the gasket 210 may be from about ⅟₁₆ inches to about ½ inches. Without limitations, the thickness of the gasket 210 may be ¼ inches. Each bracket 205 and gasket 210 may be configured to seal and contain an end 235 of each of the plurality of slats 215 within the plurality of openings 225 of the frame 200. The bracket 205 may be any suitable size, height, shape, and combinations thereof. In embodiments, the height of the bracket 205 may be similar or approximate to the height of the frame 200. The bracket 205 may comprise any suitable materials, such as but not limited to, metals, nonmetals, polymers, ceramics, composites, and combinations thereof. In embodiments, the bracket 205 may be coupled to the frame 200 through any suitable means, including but not limited to fasteners, adhesives, welding, brazing, snap-fit, threading, and the like. As illustrated, the bracket 205 may comprise bracket holes 240 to be used to attach the air intake assembly 115 to the structure, wherein the air intake assembly 115 is disposed within the existing opening of the structure. In one or more embodiments, suitable fasteners may be used with the bracket holes 240 of the bracket 205 to couple the air intake assembly 115 to the structure.

Figure 4:
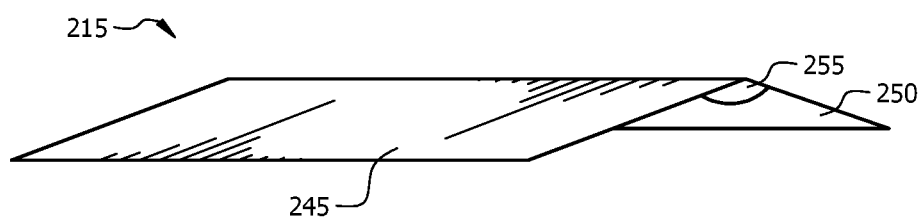
FIG. 4 illustrates an example of one of a plurality of slats of the air intake assembly of FIGS. 2-3, in accordance with an embodiment of the present disclosure.

FIG. 4 illustrates an example of one of the plurality of slats 215. In one or more embodiments, each of the plurality of slats 215 may be disposed within the frame 200 (referring to FIG. 2) through the plurality of openings 225 (referring to FIG. 3). The plurality of slats 215 may comprise any suitable materials, such as but not limited to, metals, nonmetals, polymers, ceramics, composites, and combinations thereof. Without limitations, each one of the plurality of slats 215 may comprise 16-gauge aluminum. The plurality of slats 215 may be any suitable size, height, shape, and combinations thereof. Without limitations, each one of the plurality of slats 215 may generally have a V-shape, but each one of the plurality of slats 215 is not limited to such a shape. In embodiments, each one of the plurality of slats 215 may comprise a first side 245 and a second side 250, wherein the first side 245 and the second side 250 are coupled together and there is an angle 255 between them. In embodiments, the angle 255 may be any suitable angle. Without limitations, the angle 255 may be from about 5° to about 90°. In embodiments, the angle 255 may be about 45°. In one or more embodiments, the width of the first side 245 and the second side 250 may be equivalent or approximate to each other. In other embodiments, the width of the first side 245 and the second side 250 may be different. Without limitations, the width of both the first side 245 and the second side 250 may be about ½ inch. In embodiments, the length of the plurality of slats 215 may be similar to or equivalent to the width of the frame 200. There may be any suitable number of the plurality of slats 215 disposed within the frame 200 so as to prevent the interior of the structure, wherein the air intake assembly 115 is disposed, from being visually inspected from the exterior of the structure.

With reference back to FIGS. 2-3, as illustrated, the stiffener 220 may be disposed within an interior of the frame 200. The stiffener 220 may be configured to provide structural support to the plurality of slats 215. In embodiments, the stiffener 215 may comprise a plurality of openings (not shown) similar to those of the frame 200, wherein the plurality of slats 215 may be disposed through the plurality of openings. In these embodiments the plurality of openings of the stiffener 220 may be disposed in the same pattern and shape as the plurality of openings 225 of the frame 200 so as to mirror the plurality of openings 225 of the frame 200. As the stiffener 220 is disposed within the same x-y plane as the frame 200, the plurality of openings 225 of the frame 200 and those of the stiffener 220 may align. In embodiments, the stiffener 220 may be coupled to the frame 200 through any suitable means, including but not limited to fasteners, adhesives, welding, brazing, snap-fit, threading, and the like. In one or more embodiments, there may be a plurality of stiffeners 220 utilized in the air intake assembly 115 to structurally support the plurality of slats 215. In those embodiments, each of the plurality of stiffeners 220 may be disposed within the frame 200, wherein the plurality of slats 215 may be disposed through each of the plurality of stiffeners 220. In certain embodiments, there may be a tolerance between the plurality of slats 215 and both the plurality of openings 225 of the frame 200 and those of the stiffener 220. In other embodiments, the plurality of slats 215 may be flush against the surface area of the plurality of openings 225 of the frame 200 and those of the stiffener 220.

Although the disclosure and its advantages have been described in detail, it should be understood that various changes, substitutions and alterations can be made herein without departing from the spirit and scope of the disclosure as defined by the following claims.

What is claimed is:

1. An air intake assembly configured to prevent the interior of a structure from being visually inspected from the exterior of the structure, comprising:
    a frame comprising a plurality of openings, wherein each one of the plurality of openings comprises a V-shaped cross-section;
    a plurality of slats, wherein each one of the plurality of slats comprises a V-shaped cross-section;
    a stiffener configured to provide structural support to the plurality of slats, wherein the stiffener is disposed within an interior of the frame wherein the plurality of slats are disposed within the frame through the plurality of openings of the frame and through the stiffener;
    a bracket comprising at least one bracket hole configured to couple the bracket to the cabinet, wherein the bracket is disposed along a side of the frame; and
    a gasket disposed in between the bracket and the side of the frame.

2. The air intake assembly of claim 1, wherein each one of the plurality of slats comprises a first side, a second side, and an angle between the first side and the second side.

3. The air intake assembly of claim 2, wherein the angle between the first side and the second side of each one of the plurality of slats is about 45°.

4. The air intake assembly of claim 2, wherein the width of both the first side and the second side of each one of the plurality of slats is about ½ inch.

5. The air intake assembly of claim 1, wherein each one of the plurality of slats comprises 16-gauge aluminum.

6. The air intake assembly of claim 1, wherein the length of the plurality of slats is equivalent to the width of the frame.

7. The air intake assembly of claim 1, wherein the air intake assembly is coupled to a cabinet, wherein the air intake assembly is configured to provide air flow between an exterior of the cabinet and an interior of the cabinet and to inhibit a line of sight into the cabinet, wherein the depth of the frame from the cabinet is less than 1 inch.

8. The air intake assembly of claim 7, wherein the frame comprises a plurality of holes configured to couple the frame to the cabinet.

9. The air intake assembly of claim 1, wherein the bracket and the gasket are configured to seal and contain an end of each one of the plurality of slats within the plurality of openings of the frame.

10. The air intake assembly of claim 1, wherein the height of the gasket is approximately equivalent to the height of the bracket, wherein the thickness of the gasket is about ¼ inch.

11. The air intake assembly of claim 1, further comprising a plurality of stiffeners, wherein each one of the plurality of stiffeners is disposed within an interior of the frame and configured to provide structural support to the plurality of slats.

12. A system, comprising:
a cabinet, comprising:
electrical equipment; and
a plurality of cables; and
an air intake assembly, wherein the air intake assembly is coupled to the cabinet, wherein the air intake assembly is configured to provide air flow between an exterior of the cabinet and an interior of the cabinet and to inhibit a line of sight into the cabinet, wherein the air intake assembly comprises:
a frame comprising a plurality of openings, wherein each one of the plurality of openings comprises a V-shaped cross-section;
a plurality of slats, wherein each one of the plurality of slats comprises a V-shaped cross-section;
a stiffener configured to provide structural support to the plurality of slats, wherein the stiffener is disposed within an interior of the frame wherein the plurality of slats are disposed within the frame through the plurality of openings of the frame and through the stiffener;
a bracket comprising at least one bracket hole configured to couple the bracket to the cabinet, wherein the bracket is disposed along a side of the frame; and
a gasket disposed in between the bracket and the side of the frame.

13. The system of claim 12, wherein each one of the plurality of slats comprises a first side, a second side, and an angle between the first side and the second side.

14. The system of claim 13, wherein the angle between the first side and the second side of each one of the plurality of slats is about 45°.

15. The system of claim 13, wherein the width of both the first side and the second side of each one of the plurality of slats is about ½ inch.

16. The system of claim 12, wherein the length of the plurality of slats is equivalent to the width of the frame, and wherein each one of the plurality of slats comprises 16-gauge aluminum.

17. The system of claim 12, wherein the frame comprises a plurality of holes configured to couple the frame to the cabinet, wherein the depth of the frame from the cabinet is less than 1 inch.

18. The system of claim 12, wherein the bracket and the gasket are configured to seal and contain an end of each one of the plurality of slats within the plurality of openings of the frame, wherein the thickness of the gasket is about ¼ inch, and wherein the height of the gasket is approximately equivalent to the height of the bracket.

* * * * *